United States Patent
Sato et al.

(10) Patent No.: US 6,440,828 B1
(45) Date of Patent: *Aug. 27, 2002

(54) PROCESS OF FABRICATING SEMICONDUCTOR DEVICE HAVING LOW-RESISTIVE CONTACT WITHOUT HIGH TEMPERATURE HEAT TREATMENT

(75) Inventors: Shunichiro Sato; Toshiki Shinmura; Yoshiaki Yamada; Tetsuya Taguwa; Koji Urabe, all of Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/866,330

(22) Filed: May 30, 1997

(30) Foreign Application Priority Data

May 30, 1996 (JP) .............................................. 8-136679

(51) Int. Cl.$^7$ ............................................ H01L 21/426
(52) U.S. Cl. ........................ 438/533; 438/621; 438/766
(58) Field of Search ................................ 438/659, 655, 438/643, 535, 533, 526, 530, 305, 303, 210, 514–534, 682–683, 582, 583, 621, 625, 627, 629, 630, 648, 649, 656, 766

(56) References Cited

U.S. PATENT DOCUMENTS

| | | | | |
|---|---|---|---|---|
| 4,683,645 A | * | 8/1987 | Naguib et al. | 438/301 |
| 4,701,349 A | * | 10/1987 | Koyanagi et al. | 438/655 |
| 5,122,479 A | * | 6/1992 | Audet et al. | 438/659 |
| 5,302,549 A | * | 4/1994 | Santangelo et al. | 438/530 |
| 5,369,055 A | * | 11/1994 | Chung | 438/533 |
| 5,478,780 A | * | 12/1995 | Koerner et al. | 438/653 |
| 5,536,684 A | * | 7/1996 | Dass et al. | 438/535 |
| 5,567,651 A | * | 10/1996 | Berti et al. | 438/303 |
| 5,593,924 A | * | 1/1997 | Apte et al. | 438/647 |
| 5,654,210 A | * | 8/1997 | Aronowitz et al. | 438/526 |

(List continued on next page.)

FOREIGN PATENT DOCUMENTS

| | | | | |
|---|---|---|---|---|
| EP | 0 746 012 | * | 12/1996 | |
| JP | 63-142865 | * | 6/1988 | 438/385 |
| JP | 4-215424 | | 8/1992 | |

OTHER PUBLICATIONS

R.T. Tung, "Surface nucleation of Ti silicides at elevated temperatures", Appl. Phys. Lett. 68 (Apr. 1, 1996) 1933–1935.*

S. Wolf, "Silicon Processinbg for the VLSI Era", vol. 2, Lattice press, Sunset Beach, CA, USA, p. 150, 1990.*

A. Sakamoto et al., "Lower Thickness of Ti Film in BLK–W Contact", *Proceedings of 38th Spring Conference of Applied Physics Society*, 30p–W–7, p. 691 with partial English–language translation.

*Primary Examiner*—Howard Weiss
*Assistant Examiner*—Marcos D. Pizarro-Crespo
(74) *Attorney, Agent, or Firm*—Sughrue Mion PLLC

(57) ABSTRACT

A miniature contact is incorporated in a semiconductor device for transferring an electric signal between a conductive wiring and an impurity region, and a titanium silicide and a single crystal silicon region doped with an impurity forms an ohmic contact; in order to form the ohmic contact, a surface portion of the single crystal silicon region is made amorphous by using an ion-bombardment, thereafter, titanium is deposited on the amorphous silicon to have the thickness ranging between 3 nanometers and 10 nanometers, and the titanium layer is converted to a titanium silicide layer through an annealing at 400 degrees to 500 degrees in centigrade, thereby forming the low-resistive ohmic contact without changing the impurity profile of the single crystal silicon region.

8 Claims, 11 Drawing Sheets

U.S. PATENT DOCUMENTS

| | | | | |
|---|---|---|---|---|
| 5,702,972 A | * | 12/1997 | Tsai et al. | 438/305 |
| 5,726,083 A | * | 3/1998 | Takaishi | 438/210 |
| 5,731,226 A | * | 3/1998 | Lin et al. | 438/607 |
| 5,744,395 A | * | 4/1998 | Shue et al. | 438/305 |
| 5,756,391 A | * | 5/1998 | Tsuchiaki | 438/592 |
| 5,804,505 A | * | 9/1998 | Yamada et al. | 438/643 |
| 5,885,896 A | * | 3/1999 | Thakur | 438/649 |
| 5,891,785 A | * | 4/1999 | Chang | 438/305 |
| 6,004,871 A | * | 12/1999 | Kittl et al. | 438/592 |

* cited by examiner

PROCESS OF FABRICATING SEMICONDUCTOR DEVICE HAVING LOW-RESISTIVE CONTACT WITHOUT HIGH TEMPERATURE HEAT TREATMENT

FIELD OF THE INVENTION

This invention relates to a process of fabricating a semiconductor device and, more particularly, to a process of fabricating a semiconductor device with a low-resistive contact without a high temperature heat treatment.

DESCRIPTION OF THE RELATED ART

In order to form a low-resistivity contact with a semiconductor substrate in a contact hole, refractory metal film is deposited so as to cover the contact area of the semiconductor substrate, and the refractory metal reacts with the semiconductor through a heat-treatment so as to produce a refractory metal silicide layer. Titanium is attractive, because the titanium forms a low Schottky barrier together with any one of the p-type semiconductors and the n-type semiconductors. Moreover, the titanium easily reduces natural oxide unavoidably covering the contact area, and the silicidation smoothly proceeds.

An experiment is reported by Akihiro Sakamoto et al in "Lower Thickness Limit of Ti Film in BLK-W Contact", Proceedings of 38th. Spring Conference of Applied Physics Society, 30p-W-7. According to the paper, a titanium film was deposited form 5 nanometers to 40 nanometers thick on a single crystal silicon substrate, and was annealed at 800 degrees centigrade for 30 seconds. Sakamoto et. al. taught that the contact resistance was drastically increased when the titanium film was equal to or less than 10 nanometers thick.

A process of forming a metal-semiconductor ohmic contact is disclosed in Japanese Patent Publication of Unexamined Application No. 4-215424. According to the Japanese Patent Publication of Unexamined Application, arsenic was ion implanted into a semiconductor layer so as to make the semiconductor layer amorphous, and titanium was deposited to 100 nanometers thick on the amorphous semiconductor layer. The titanium layer was annealed at a low temperature equal to or less than 500 degrees centigrade.

The first prior art ohmic contact disclosed in the paper encounters a problem in high contact resistance, because the ohmic contact is formed with the single crystal silicon. The high temperature annealing is another problem. The high temperature annealing causes the dopant impurity to be diffused into the silicon substrate, and destroys the impurity profile.

The impurity profile is less affected in the second prior art process, because the titanium layer is annealed at the relatively low temperature. However, the amorphous silicon layer requires the thick titanium layer of 100 nanometers thick, and the deposition consumes time and a large amount of titanium. Thus, the second prior art process encounters another problem in high production cost.

A problem inherent in the second prior art contact is a high contact resistance. The high contact resistance is derived from shortage of dopant impurity in the contact area. The dopant impurity tends to be diffused into the thick refractory metal silicide layer, and makes the dopant concentration in the contact area light. This tendency is conspicuous in a miniature contact hole of the order of 0.5 micron by 0.5 micron square or 0.5 micron in diameter.

The aspect ratio of the contact hole is getting larger and larger together with the integration density. It is impossible to properly deposit refractory metal on the bottom surface of a miniature contact hole with a large aspect ratio through sputtering. Device manufacturers try to use a chemical vapor deposition so as to perfectly grow a refractory metal layer or a refractory metal silicide layer over the surface defining the miniature contact hole with the large aspect ratio. However, the refractory metal grows differently on the contact area depending upon the conductivity type of the contact area. When the refractory metal is concurrently deposited on a heavily doped p-type contact area and a heavily doped n-type contact area, the refractory metal layer on the heavily doped p-type contact area is different in thickness from the heavily doped n-type contact area. If one of the refractory metal layers is optimized, the other refractory metal layer is so thin that the electric resistance is increased. On the other hand, if the other refractory metal layer is optimized, the refractory metal layer is too thick, and leakage current is increased.

SUMMARY OF THE INVENTION

It is therefore an important object of the present invention to provide a process of fabricating a semiconductor device through which the contact resistance of a miniature contact hole is decreased by using a low temperature heat treatment.

It is also an important object of the present invention to provide a process of fabricating a semiconductor device through which contact areas different in conductivity type are properly covered with refractory metal layers or refractory metal silicide layers.

The present inventors contemplated the problems, and investigated influences of crystal structure on the contact resistance. The present inventors formed p-type single crystal impurity regions exposed by miniature contact holes of 0.5 micron square and p-type amorphous impurity regions also exposed by miniature contact holes of 0.5 micron square. The present inventors deposited titanium on the p-type single crystal impurity regions and the p-type amorphous impurity regions, and varied the thickness of the titanium layers. The titanium layers were treated with heat at 500 degrees centigrade for 30 minutes in nitrogen ambience, and titanium silicide layers formed contacts with the p-type single crystal impurity regions and the p-type amorphous impurity regions. The present inventors measured the contact resistance, and plotted the contact resistances in FIG. 1. Plot PL1 represents the contact resistance of the p-type single crystal impurity regions, and plot PL2 was indicative of the contact resistance of the p-type amorphous impurity regions.

The present inventors noticed that the contact resistance was varied between the single crystal and the amorphous silicon regions. The single crystal region required a thick titanium layer for a low resistivity contact, while the amorphous region formed a low-resistivity contact between 3 nanometers thick and 10 nanometers thick. The present inventors first concluded that the amorphous refractory metal layer between 3 nanometers and 10 nanometers thick was desirable for a low-resistivity contact.

The present inventors further investigated growing technologies, and found that a chemical vapor deposition was available for refractory metal deposited on an amorphous dopant impurity region exposed by a miniature contact hole with a large aspect ratio. A contact region was changed to amorphous by using an ion-implantation. Boron/boron difluoride ($BF_2$) or phosphorous/arsenic was desirable for the ion-implantation. If $TiCl_4$ was reduced in the chemical vapor deposition, titanium was deposited at a certain temperature not higher than 600 degrees centigrade.

In accordance with one aspect of the present invention, there is provided a process of fabricating a semiconductor device on a semiconductor substrate, comprising: a) preparing a semiconductor layer; b) forming an insulating layer over the semiconductor layer; c) forming an opening in the insulating layer so that the semiconductor layer is exposed to the opening; d) making the semiconductor layer exposed to the opening amorphous; e) depositing a refractory metal layer from 3 nanometers to 10 nanometers thick on the semiconductor layer; and f) treating the refractory metal layer with heat so as to convert the refractory metal layer to a refractory metal silicide layer.

In accordance with another aspect of the present invention, there is provided a process of fabricating a semiconductor device, comprising the steps of: a) preparing a semiconductor layer; b) forming an insulating layer having an opening where the semiconductor layer is exposed; c) making the semiconductor layer exposed to the opening amorphous; and d) depositing a refractory metal layer by using a chemical vapor deposition so as to grow a refractory metal silicide on the semiconductor layer.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1:
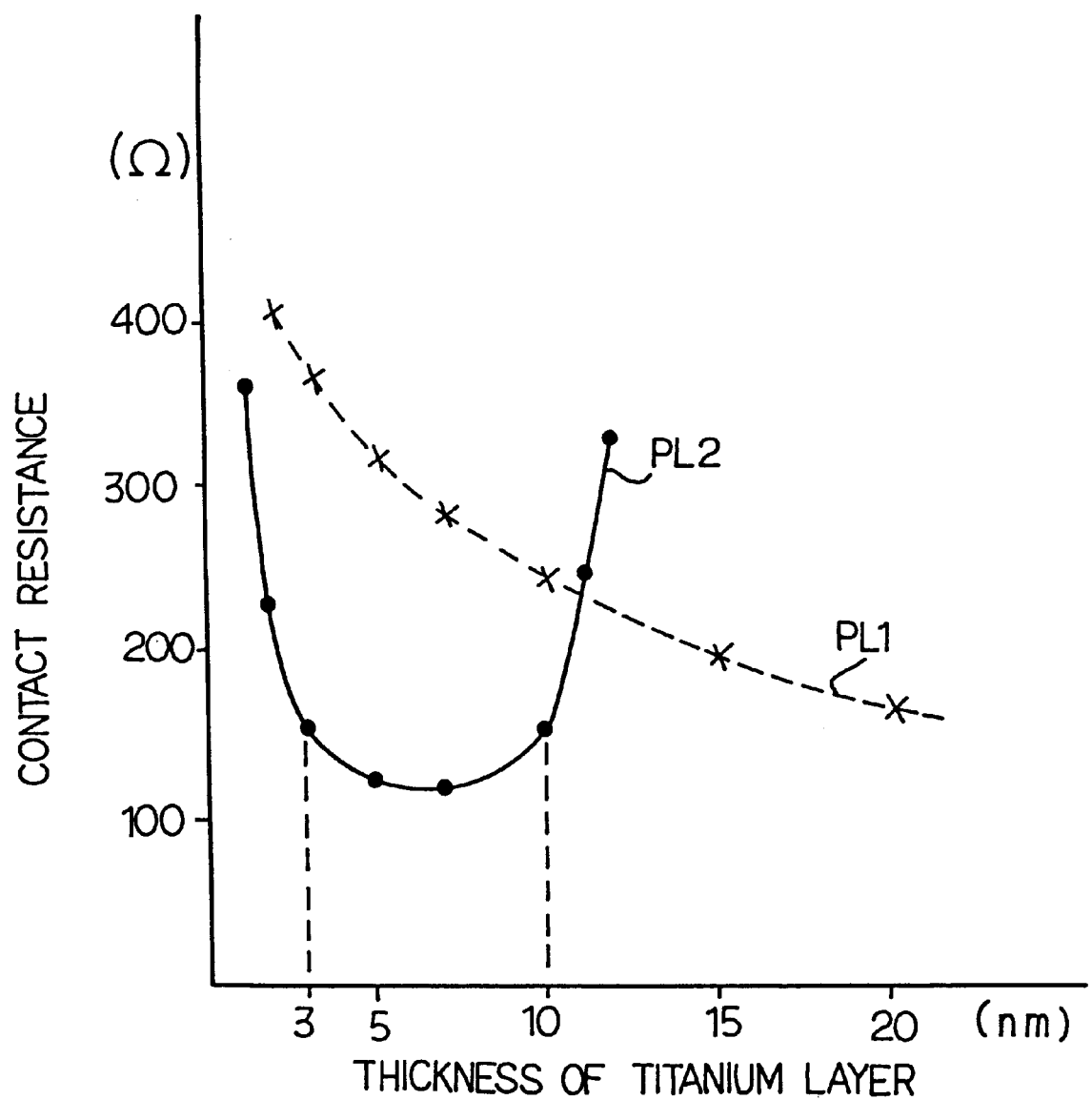
FIG. 1 is a graph showing relation between contact resistance and the thickness of a titanium layer on the bottom surface of a contact hole.

FIGS. 2A to 2F illustrate a process of fabricating a semiconductor device embodying the present invention. The process starts with preparation of a p-type single crystal silicon substrate 1a, and a field oxide layer 1b is selectively grown on the major surface of the p-type silicon substrate 1a. The field oxide layer 1b defines a plurality of active areas in the major surface, and two active areas are shown in FIGS. 2A to 2F. A lightly doped n-type well 3a is formed in one of the active areas, and a heavily doped p-type impurity region 3b and a heavily doped n-type impurity region 4a are formed in the lightly doped n-type well 3a and the other of the active areas, respectively. The heavily doped p-type impurity region 3b is electrically isolated from the heavily doped n-type impurity region 4a by means of the field oxide layer 1b.

Boro phospho-silicate glass is deposited to 1.5 microns thick over the entire surface of the resultant semiconductor structure by using a chemical vapor deposition, and forms an inter-level insulating layer 5a.

Photo-resist solution is spun onto the inter-level insulating layer 5a, and is baked so as to form a photo-resist layer on the inter-level insulating layer 5a. A pattern image representative of contact holes is optically transferred to the photo-resist layer so as to form a latent image therein. The latent image is developed, and the photo-resist layer is patterned into a photo-resist etching mask (not shown) for the contact holes. Thus, the photo-resist etching mask is provided on the inter-level insulating layer 5a through a lithography.

Figure 2A:
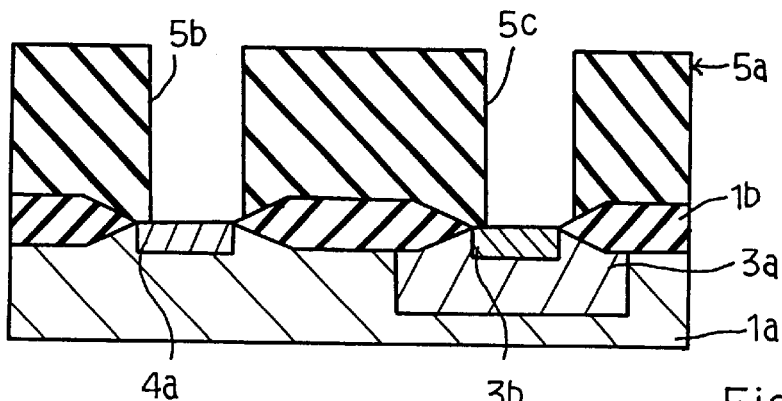
FIGS. 2A to 2F are cross sectional views showing a process of fabricating a semiconductor device according to the present invention.

Using the photo-resist etching mask, the inter-level insulating layer 5a is selectively etched so as to form contact holes 5b and 5c therein. The heavily doped n-type impurity region 4a and the heavily doped p-type impurity region 3b are respectively exposed to the contact holes 5b/5c of 0.5 micron square as shown in FIG. 2A. In this instance, openings of the photo-resist etching mask are slightly deviated from target positions over the heavily doped n-type impurity region 4a and the heavily doped p-type impurity region 3b, and, for this reason, the contact holes 5b/5c are not exactly nested in the heavily doped n-type impurity region 4a and the heavily doped p-type impurity region 3b, respectively.

Figure 2B:
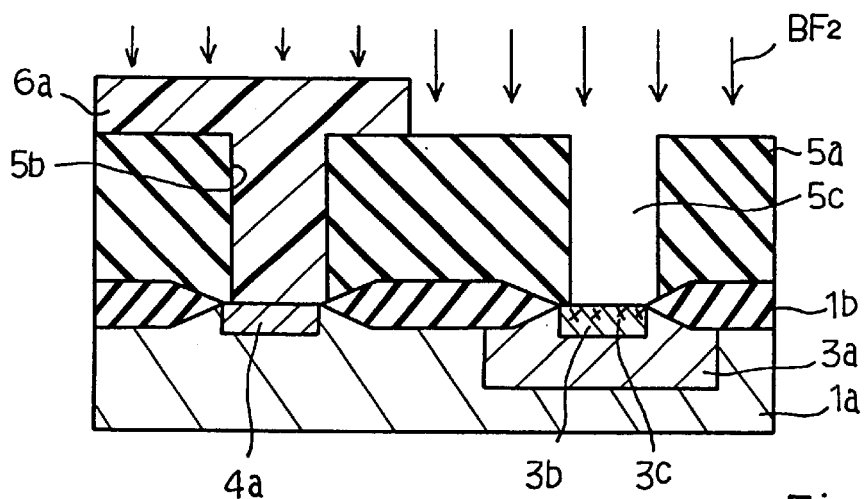

Subsequently, a photo-resist ion-implantation mask 6a is formed on the inter-level insulating layer 5a by using lithography, and the heavily doped n-type impurity region 4a is covered with the photo-resist ion-implantation mask 6a. Boron difluoride (BF$_2$) is ion-implanted through the contact hole 5c into the heavily doped p-type single crystal impurity region 3b at dose of $5 \times 10^{14}$ cm$^{-2}$ to $5 \times 10^{15}$ cm$^{-2}$ under acceleration energy of 10 KeV to 30 KeV. A surface portion of the heavily doped p-type impurity region 3a becomes amorphous due to the ion bombardment expressed by mark "x", and a p-type amorphous silicon layer 3c is formed in the heavily doped p-type single crystal impurity region 3b as shown in FIG. 2B. After the ion-implantation, the photo-resist ion-implantation mask 6a is stripped off, and the heavily doped n-type single crystal impurity region 4a is exposed again.

Figure 2C:
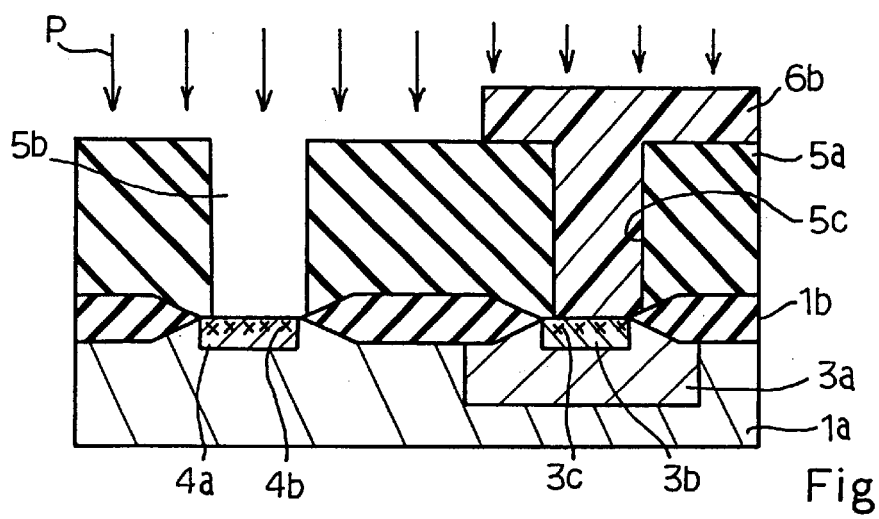

Another photo-resist ion-implantation mask 6b is provided on the inter-level insulating layer 5a by using the lithography, and the p-type amorphous silicon layer 3c is covered with the photo-resist ion-implantation mask 6b. Phosphorous is ion implanted through the contact hole 5b into the heavily doped n-type single crystal impurity region 4a at dose of $3 \times 10^{14}$ cm$^{-2}$ to $1 \times 10^{15}$ cm$^{-2}$ under acceleration energy of 10 KeV to 70 KeV. A surface portion of the heavily doped n-type single crystal impurity region 4a becomes amorphous due to the ion bombardment expressed by mark "x", and an n-type amorphous silicon layer 4b is formed in the surface portion as shown in FIG. 2C. After the ion-implantation, the photo-resist ion-implantation mask 6b is stripped off.

Subsequently, titanium is sputtered over the entire surface of the resultant semiconductor structure, and a titanium layer 7a topographically extends over the entire surface. A collimator plate (not shown) is provided between the titanium target and the semiconductor structure shown in FIG. 2C for preventing the semiconductor structure from titanium particles obliquely radiated from the target, and has an aspect ratio of 3 in this instance. When the titanium is deposited through the collimator plate over the entire surface containing the bottom surfaces of the contact holes 5b/5c and the upper surface of the interlevel insulating layer 5a, the titanium layer 7a is not uniformly deposited, and the ratio of the titanium layer on the bottom surface to the titanium layer on the upper surface is of the order of 13 percent. In order to regulate the titanium layer 7a from 3 nanometers to 10 nanometers thick, the titanium layer 7a is deposited from 23 nanometers to 77 nanometers thick on the upper surface of the inter-level insulating layer 5a.

Figure 2D:
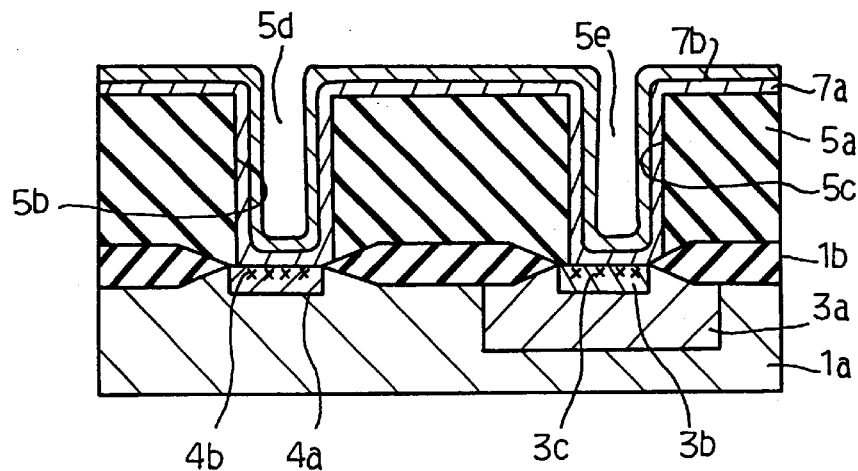

Titanium nitride is sputtered over the titanium layer 7a, and the titanium layer 7a is overlain by a titanium nitride layer 7b as shown in FIG. 2D. The titanium nitride layer 7b is 100 nanometers thick over the upper surface of the inter-level insulating layer 5a. The titanium nitride layer 7b defines secondary holes 5d and 5e in the contact holes 5b and 5c, respectively. The titanium nitride layer 7b does not allow the titanium layer 7a to be nitrided in an annealing step, and the titanium nitride layer 7b allows the manufacturer to decrease the thickness of the titanium layer 7a. The titanium nitride layer 7b further serves as a barrier layer against tungsten in a later stage.

Figure 2E:
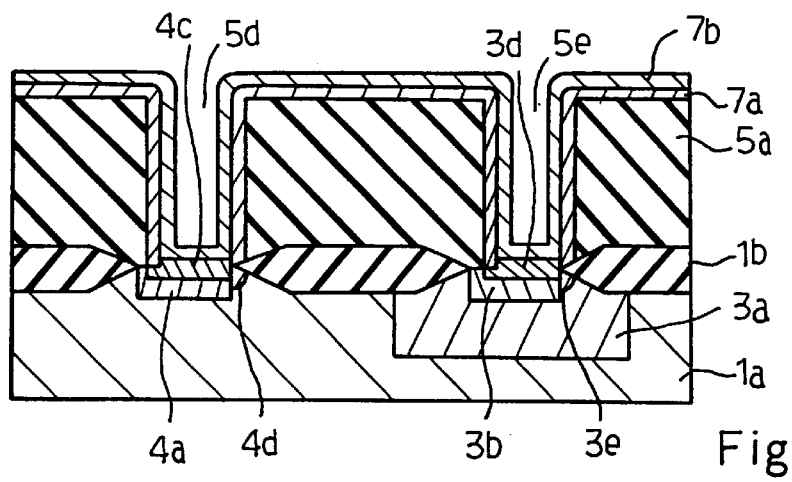

The resultant semiconductor structure is placed in nitrogen ambience, and is heated to between 400 degrees and 500 degrees centigrade. The semiconductor structure is maintained in the high temperature nitrogen ambience for 10 minutes to 60 minutes, and the titanium reacts with the p-type amorphous silicon 3c and the n-type amorphous silicon 4b so as to form titanium silicide layers 3d/4c as shown in FIG. 2E. Thus, the titanium reacts with the silicon at 400 degrees to 500 degrees centigrade, because the silicon is amorphous.

The p-type amorphous silicon and the n-type amorphous silicon are recrystallized during the annealing. The annealing temperature is low enough that the heavily doped n-type single crystal impurity region 4a and the heavily doped p-type single crystal impurity region 3b maintain the impurity profiles. Moreover, the heat activates the boron difluoride and the phosphorous both implanted beneath the periphery of the field oxide layer 1b, and the boron difluoride and the phosphorous form an additional p-type impurity region 3e and an additional n-type impurity region 4d merged into the heavily doped p-type single crystal impurity region 3b and the heavily doped n-type single crystal impurity region 4a. Thus, the contact holes 5b/5c are finally nested into the heavily doped n-type single crystal impurity region 4a/4d and the heavily doped p-type single crystal impurity region 3b/3e, respectively, and the mis-alignment of the photoresist etching mask for the contact holes does not deteriorate electric characteristics of contacts between the heavily doped p-type/n-type single crystal impurity regions 3b/3e/4a/4d and conductive plugs formed in the secondary holes 5d/5e at a later stage. The ion-implanted impurities are activated at 10 to 50 percent through the annealing at 400 degrees to 500 degrees centigrade with respect to the annealing at 850 degrees centigrade, and reverse leakage current across the p-n junction is ten times larger than that annealed at 850 degrees centigrade. However, the reverse leakage current is admittable in a standard semiconductor integrated circuit.

Subsequently, tungsten is deposited over the titanium nitride layer 7b. The tungsten fills the secondary holes 5d/5e, and swells into a tungsten layer of 0.5 micron thick over the inter-level insulating layer 5a. A photo-resist etching mask (not shown) is formed on the tungsten layer by using the lithography, and the tungsten layer is selectively etched away. As a result, tungsten plugs 7c/7d are left in the secondary holes 5d/5e. The photo-resist etching mask is stripped off.

Figure 2F:
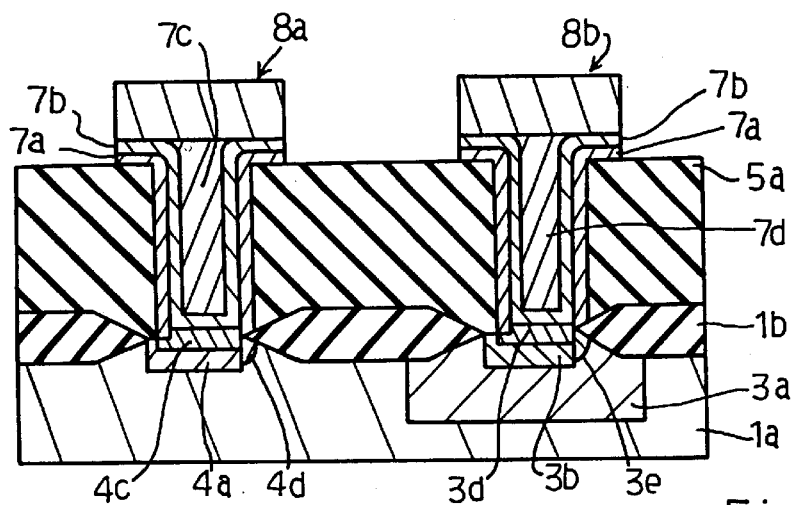

Aluminum alloy target (not shown) is prepared, and contains copper at 0.5 percent. The aluminum alloy is deposited to 0.5 micron thick over the entire surface of the resultant semiconductor structure by using a sputtering, and a photo-resist etching mask (not shown) is provided on the aluminum alloy layer by using the lithography. The aluminum alloy layer, the titanium nitride layer and the titanium layer are selectively etched away, and form multi-layer metal wirings 8a and 8b as shown in FIG. 2F.

The titanium layer 7a ranges from 3 nanometers to 10 nanometers thick according to the present invention. If the titanium layer 7a is thinner than 3 nanometers, the titanium silicide layer 4c/3d are too thin to decrease the contact resistance. On the other hand, if the titanium layer 7a is thicker than 10 nanometers, the p-type dopant impurity and the n-type dopant impurity are diffused from the heavily doped p-type impurity region 3b and the heavily doped n-type impurity region 4a into the titanium silicide layers 3d/4c, and the resistance is increased in the n-type impurity region 4a due to shortage of the dopant impurities. Especially, the contact resistance over the n-type impurity region 4a tends to be increased. Moreover, it is hard to deposit titanium more than 10 nanometers thick on the bottom surfaces of the contact holes 5b/5c by using the sputtering.

In this instance, boron difluoride and phosphorous are ion implanted. However, boron and arsenic are available for the ion-implantation.

The present inventors evaluated the contact formed through the process described hereinbefore. The contact resistance over the heavily doped p-type single crystal impurity region 3b/3e was of the order of 150 ohms, and the contact resistance over the heavily doped n-type single crystal impurity region 4a/4d was of the order of 100 ohms.

Second Embodiment

FIGS. 3A to 3F illustrate another process embodying the present invention. The process starts with preparation of a p-type single crystal silicon substrate 11a, and a field oxide layer 11b is selectively grown on the major surface of the p-type silicon substrate 11a. The field oxide layer 11b defines a plurality of active areas in the major surface, and two active areas are shown in FIGS. 3A to 3F. A lightly doped n-type well 13a is formed in one of the active areas, and a heavily doped p-type impurity region 13b and a heavily doped n-type impurity region 14a are formed in the lightly doped n-type well 13a and the other of the active areas, respectively. The heavily doped p-type impurity region 13b is electrically isolated from the heavily doped n-type impurity region 14a by means of the field oxide layer 11b.

Boro phospho-silicate glass is deposited to 1.5 microns thick over the entire surface of the resultant semiconductor structure by using a chemical vapor deposition, and forms an inter-level insulating layer 15a.

Figure 3A:
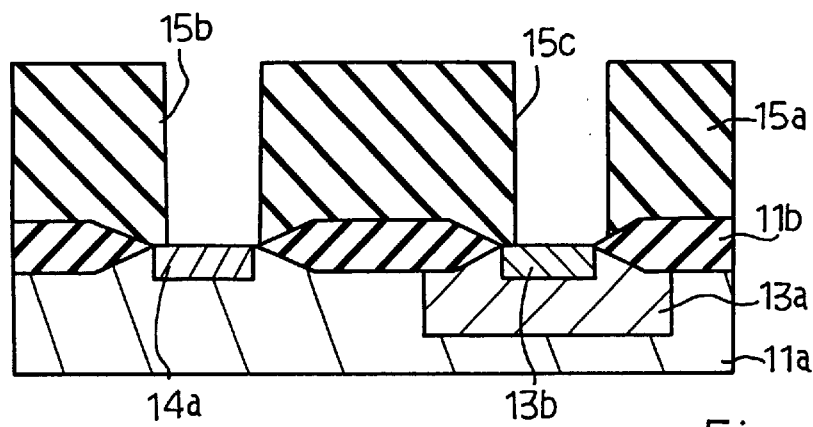
FIGS. 3A to 3F are cross sectional views showing another process of fabricating a semiconductor device according to the present invention.

A photo-resist etching mask (not shown) is provided on the inter-level insulating layer 15a through a lithography. Using the photo-resist etching mask, the inter-level insulating layer 15a is selectively etched so as to form contact holes 15b and 15c therein. The heavily doped n-type impurity region 14a and the heavily doped p-type impurity region 13b are respectively exposed by the contact holes 15b/15c of 0.5 micron square as shown in FIG. 3A. In this instance, openings of the photo-resist etching mask are slightly deviated from target positions over the heavily doped n-type impurity region 14a and the heavily doped p-type impurity region 13b, and, for this reason, the contact holes 15b/15c are not exactly nested in the heavily doped n-type impurity region 14a and the heavily doped p-type impurity region 13b, respectively.

Figure 3B:
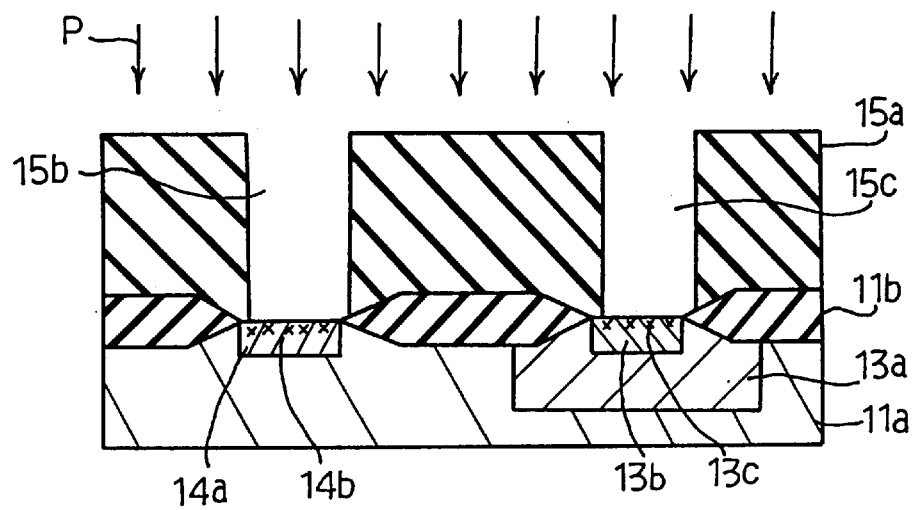

Phosphorous is ion implanted through contact holes 15b/15c into the heavily doped n-type single crystal impurity region 14a and the heavily doped p-type single crystal impurity region 13b at dose equal to or greater than $3 \times 10^{14}$ cm$^{-2}$ under acceleration energy of 70 KeV. Surface portions of these single crystal impurity regions 14a/13b become amorphous due to the ion bombardment marked with "x", and the heavily doped n-type single crystal impurity region 14a and the heavily doped p-type single crystal impurity region 13b are overlain by an n-type amorphous silicon layer 14b and a p-type amorphous silicon layer 13c, respectively, as shown in FIG. 3B. If the dose is less than $3 \times 10^{14 \, cm-2}$, the ion bombardment hardly makes the single crystal impurity regions 14b/13c amorphous.

Figure 3C:
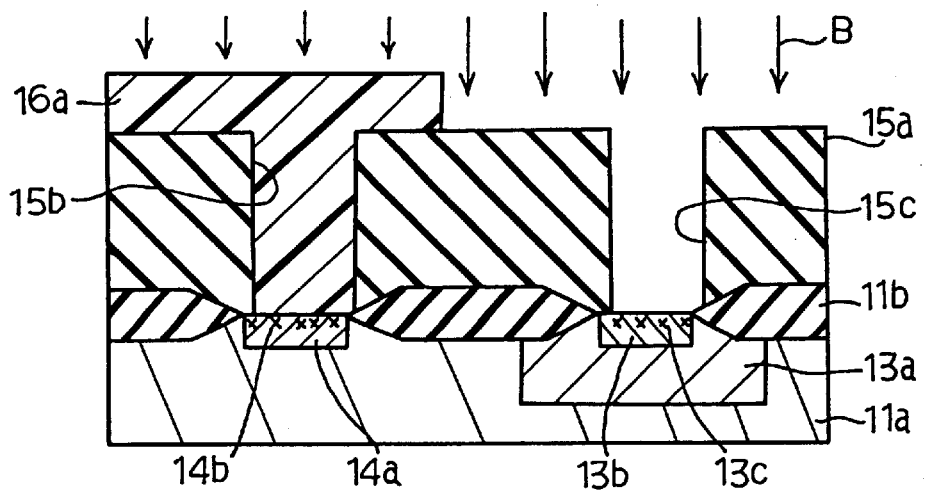

Subsequently, a photo-resist ion-implantation mask 16a is formed on the inter-level insulating layer 15a by using lithography, and the heavily doped n-type impurity region 14a is covered with the photo-resist ion-implantation mask 16a. Boron is ion-implanted through the contact hole 15c into the heavily doped p-type single crystal impurity region 13b at dose of $1 \times 10^{15}$ cm$^{-2}$ to $5 \times 10^{15}$ cm$^{-2}$ under acceleration energy of 20 KeV to 50 KeV as shown in FIG. 3C.

The boron is so light that the minimum dose for the amorphous silicon is $1 \times 10^{16}$ cm$^{-2}$. For this reason, the surface portion of the heavily doped p-type impurity region 13b is converted to an amorphous through the bombardment of phosphorous. However, the boron is expected to change the n-type well 13a beneath the field oxide layer 11b to a p-type region so as to cure the mis-alignment of the photo-resist etching mask for the contacts 15b/15c. After the ion-implantation, the photo-resist ion-implantation mask 16a is stripped off.

Subsequently, titanium is sputtered over the entire surface of the resultant semiconductor structure, and a titanium layer 17a topographically extends over the entire surface. The titanium layer 17a is not uniform in thickness as described hereinbefore, and the titanium layer 17a on the n-type amorphous layer 14b and the p-type amorphous layer 13c ranges from 3 nanometers to 10 nanometers thick.

Figure 3D:
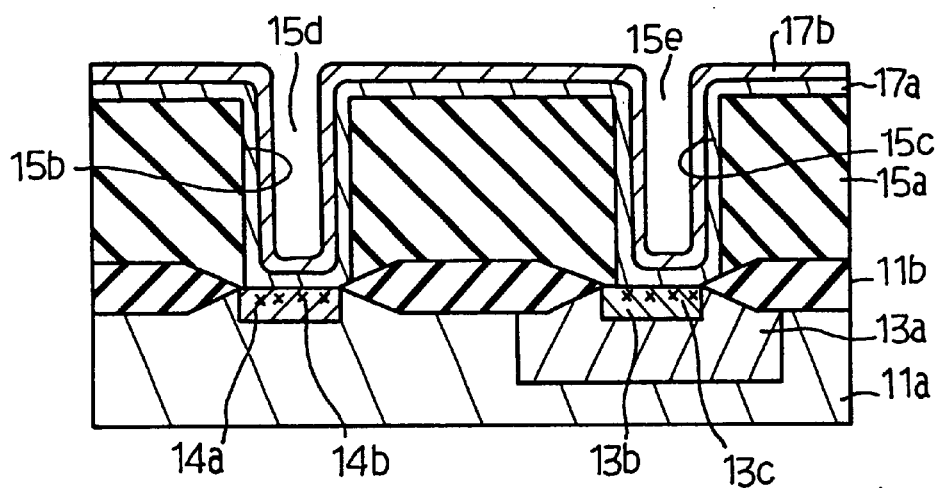

Titanium nitride is sputtered over the titanium layer 17a, and the titanium layer 17a is overlain by a titanium nitride layer 17b as shown in FIG. 3D. The titanium nitride layer 17b is 100 nanometers thick over the upper surface of the inter-level insulating layer 15a. The titanium nitride layer 17b defines secondary holes 15d and 15e in the contact holes 15b and 15c, respectively. The titanium nitride layer 17b behaves similarly to the titanium nitride layer 7b.

Figure 3E:
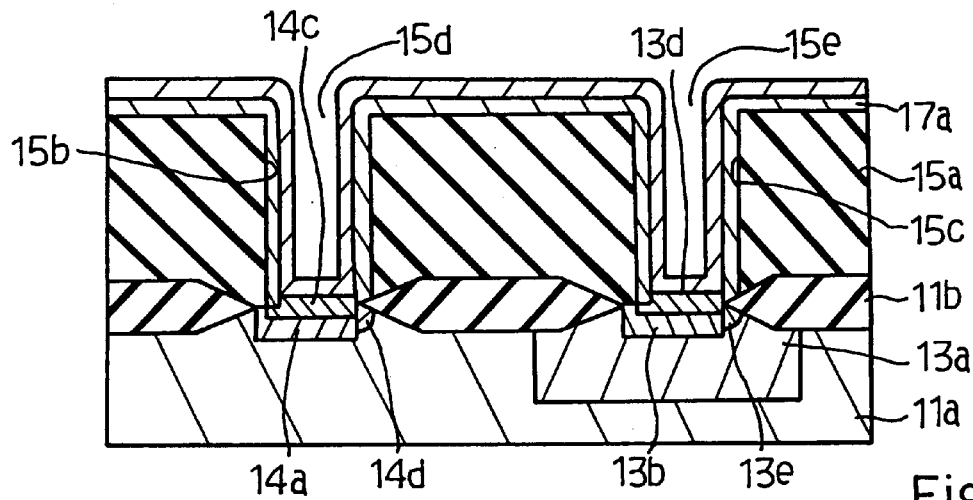

The resultant semiconductor structure is placed in nitrogen ambience, and is heated to between 400 degrees and 500 degrees centigrade. The semiconductor structure is maintained in the high temperature nitrogen ambience for 10 minutes to 60 minutes, and the titanium reacts with the p-type amorphous silicon 13c and the n-type amorphous silicon 14b so as to form titanium silicide layers 13d/14c as shown in FIG. 3E. Thus, the titanium reacts with the silicon at 400 degrees to 500 degrees centigrade, because the silicon is amorphous.

The p-type amorphous silicon and the n-type amorphous silicon are recrystallized during the annealing. The annealing temperature is low enough that the heavily doped n-type single crystal impurity region 14a and the heavily doped p-type single crystal impurity region 13b maintain the impurity profiles. Moreover, the heat activates the boron and phosphorous both implanted beneath the periphery of the field oxide layer 11b, and the boron and the phosphorous form an additional p-type impurity region 13e and an additional n-type impurity region 14d merged into the heavily doped p-type single crystal impurity region 13b and the heavily doped n-type single crystal impurity region 14a. Thus, the contact holes 15b/15c are finally nested into the heavily doped n-type single crystal impurity region 14a/14d and the heavily doped p-type single crystal impurity region 13b/13e, respectively, and the mis-alignment of the photo-resist etching mask for the contact holes does not deteriorate electric characteristics of the contacts between the heavily doped p-type/n-type single crystal impurity regions 13b/13e/14a/14d and conductive plugs formed in the secondary holes 15d/15e at a later stage.

In this instance, the p-type amorphous layer 13c is formed by using the boron instead of the boron difluoride. The boron allows the p-type amorphous layer 13c and the n-type amorphous layer 14b to be recrystallized at lower temperature within a shorter time period than the boron difluoride, and the ion-implanted dopant impurities are rapidly activated. The fluorine impedes the recrystallization and the activation. However, the fluorine is never introduced into the amorphous layers 13c/14b in this instance.

Figure 3F:
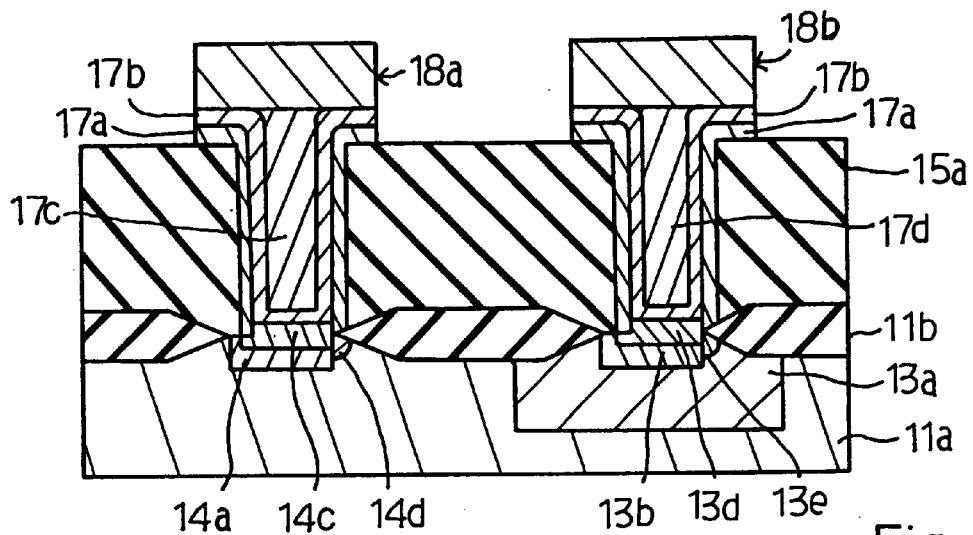

Subsequently, the secondary holes 15d/15e are plugged with pieces of tungsten 17c/17d, and multi-layer wirings 18a/18b are patterned on the inter-level insulating layer 15a as similar to the first embodiment. The resultant semiconductor structure is illustrated in FIG. 3F.

The process implementing the second embodiment achieves all the advantages of the first embodiment. Moreover, the ion-implantation of phosphorous is carried out without a photo-resist etching mask, and the process of the second embodiment is simpler than that of the first embodiment. For this reason, the production cost is decreased.

Third Embodiment

FIGS. 4A to 4H illustrate yet another process of fabricating a semiconductor device embodying the present invention. The process starts with preparation of a p-type single crystal silicon substrate 21a, and a field oxide layer 21b is selectively grown on the major surface of the p-type silicon substrate 21a. The field oxide layer 21b defines a plurality of active areas in the major surface, and two active areas are shown in FIGS. 4A to 4H. A lightly doped n-type well 23a is formed in one of the active areas, and a heavily doped p-type impurity region 23b and a heavily doped n-type impurity region 24a are formed in the lightly doped n-type well 23a and the other of the active areas, respectively. The heavily doped p-type impurity region 23b is electrically isolated from the heavily doped n-type impurity region 24a by means of the field oxide layer 21b.

Boro phospho-silicate glass is deposited to 1.5 microns thick over the entire surface of the resultant semiconductor structure by using a chemical vapor deposition, and forms an inter-level insulating layer 25a.

Figure 4A:
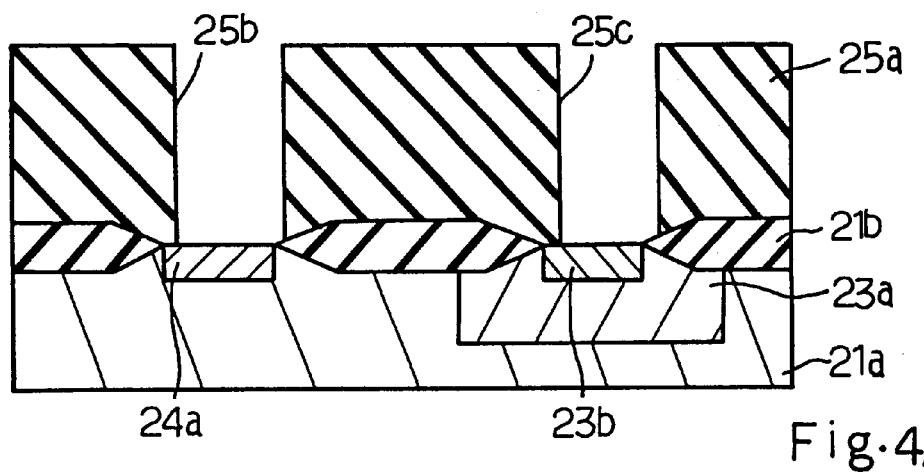
FIGS. 4A to 4H are cross sectional views showing yet another process of fabricating a semiconductor device according to the present invention.

A photo-resist etching mask (not shown) is provided on the inter-level insulating layer 25a through lithography. Using the photo-resist etching mask, the inter-level insulating layer 25a is selectively etched so as to form contact holes 25b and 25c of 0.5 micron square therein. The heavily doped n-type impurity region 24a and the heavily doped p-type impurity region 23b are respectively exposed by the contact holes 25b/25c as shown in FIG. 4A. In this instance, openings of the photo-resist etching mask are slightly deviated from target positions over the heavily doped n-type impurity region 24a and the heavily doped p-type impurity region 23b, and, for this reason, the contact holes 25b/25c are not exactly nested in the heavily doped n-type impurity region 24a and the heavily doped p-type impurity region 23b, respectively.

Figure 4B:
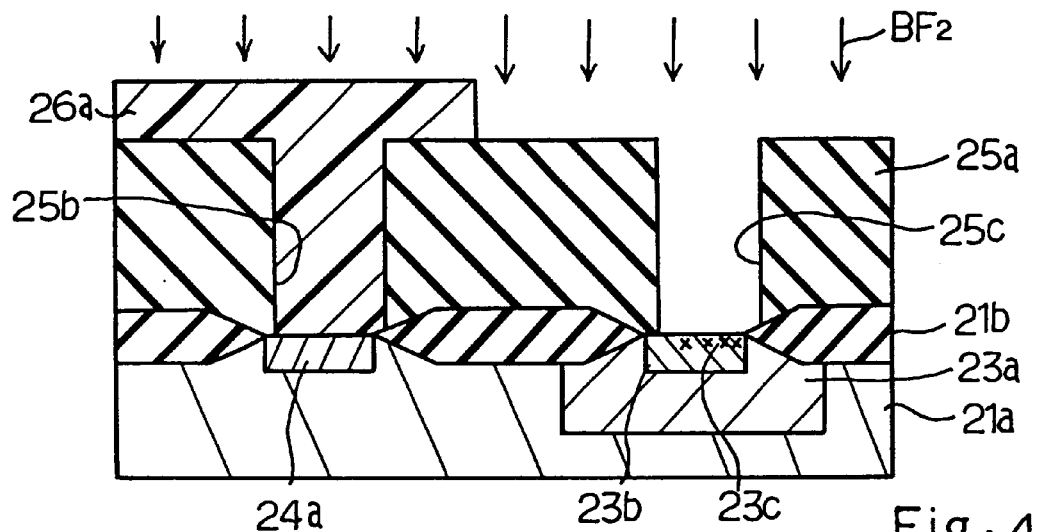

Subsequently, a photo-resist ion-implantation mask 26a is formed on the inter-level insulating layer 25a by using lithography, and the heavily doped n-type impurity region 24a is covered with the photo-resist ion-implantation mask 26a. Boron difluoride is ion implanted through the contact hole 25c into the heavily doped p-type single crystal impurity region 23b under the conditions similar to the first embodiment. A surface portion of the heavily doped p-type impurity region 23a becomes amorphous due to the ion bombardment expressed by mark "x", and a p-type amorphous silicon layer 23c is formed in the heavily doped p-type single crystal impurity region 23b as shown in FIG. 4B. After the ion-implantation, the photo-resist ion-implantation mask 26a is stripped off, and the heavily doped n-type single crystal impurity region 24a is exposed again.

Figure 4C:
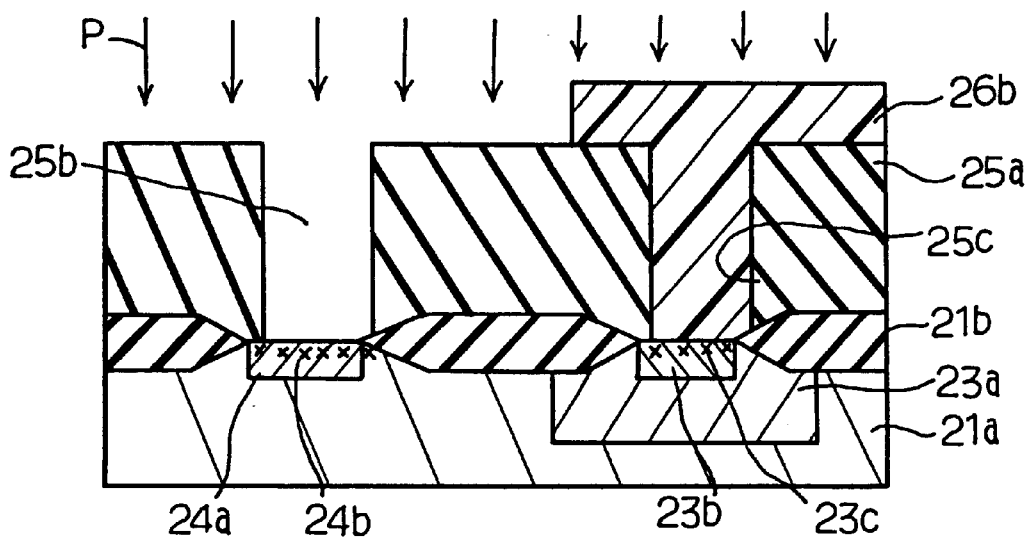

Another photo-resist ion-implantation mask 26b is provided on the inter-level insulating layer 25a by using lithography, and the p-type amorphous silicon layer 23c is covered with the photo-resist ion-implantation mask 26b. Phosphorous is ion implanted through the contact hole 25b into the heavily doped n-type single crystal impurity region 24a under the conditions similar to the first embodiment. A surface portion of the heavily doped n-type single crystal impurity region 24a becomes amorphous due to the ion bombardment expressed by mark "x", and an n-type amorphous silicon layer 24b is formed in the surface portion as shown in FIG. 4C. After the ion-implantation, the photo-resist ion-implantation mask 26b is stripped off.

Figure 4D:
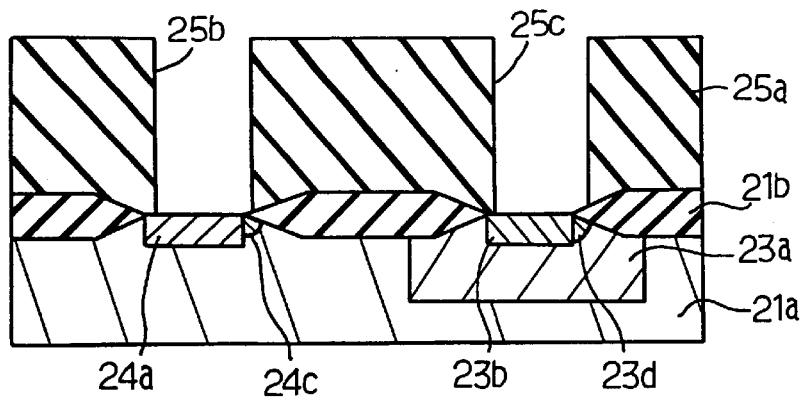

The resultant semiconductor structure is placed in inert ambience containing nitrogen. The p-type amorphous silicon layer 23c and the n-type amorphous silicon layer 24b are heated to between 800 degrees and 900 degrees centigrade, and are maintained in the high-temperature inert ambience for 10 minutes to 30 minutes. The boron of the boron difluoride and the phosphorous are perfectly activated, and the p-type amorphous silicon layer 23c and the n-type amorphous silicon layer 24b are recrystallized again. Moreover, an additional p-type region 23d and an additional n-type region 24c are merged with the heavily doped p-type single crystal impurity region 23b and the heavily doped n-type single crystal impurity region 24a. Thus, the misalignment between the heavily doped single crystal impurity regions 23b/24a and the contact holes 25c/25b is cured through the heat treatment. The resultant semiconductor structure is illustrated in FIG. 4D.

Figure 4E:
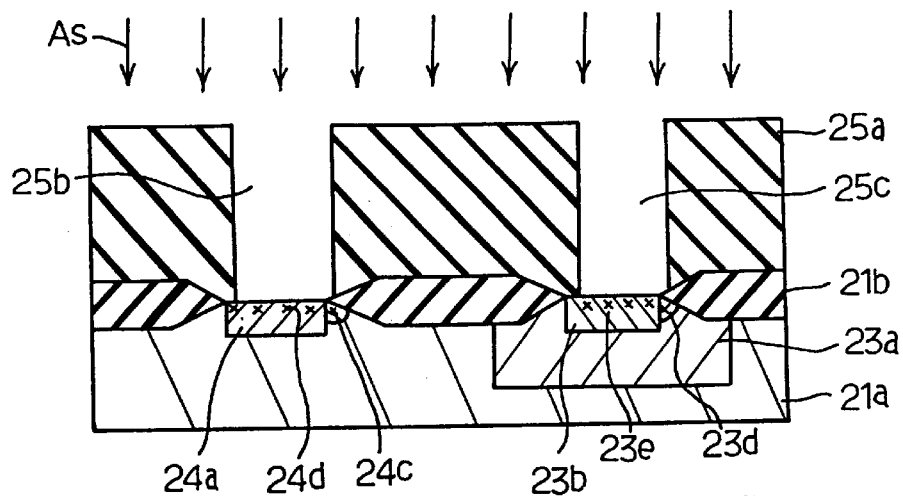

Subsequently, arsenic is ion implanted through the contact holes 25b/25c into the heavily doped p-type single crystal impurity region 23b/23d and the heavily doped n-type single crystal impurity region 24a/24c. The dose is more than $2 \times 10^{14}$ cm$^{-2}$ and much less than the dose of the boron difluoride. The acceleration energy is regulated to 30 KeV. If the dose of the arsenic is less than $2 \times 10^{14}$ cm$^{-2}$, an amorphous silicon layer is not produced. On the other hand, if the dose of the arsenic is greater than the dose of the boron difluoride, an n-type amorphous silicon layer is formed on the heavily doped p-type single crystal impurity region 23b/23d. The bombardment of arsenic makes a surface portion of the heavily doped p-type single crystal impurity region 23b/23d and a surface portion of the heavily doped n-type single crystal impurity region 24a/24c amorphous. Thus, the heavily doped p-type single crystal impurity region 23b/23d and the heavily doped n-type single crystal impurity region 24a/24c are respectively overlain by a p-type amorphous silicon layer 23e and an n-type amorphous silicon layer 24d as shown in FIG. 4E.

Subsequently, titanium is sputtered over the entire surface of the resultant semiconductor structure, and a titanium layer 27a topographically extends over the entire surface. The titanium layer 27a is not uniform in thickness, and the p-type amorphous silicon layer 23e and the n-type amorphous silicon layer 24d are covered with the titanium layer 27a ranging from 3 nanometers to 10 nanometers thick.

Figure 4F:
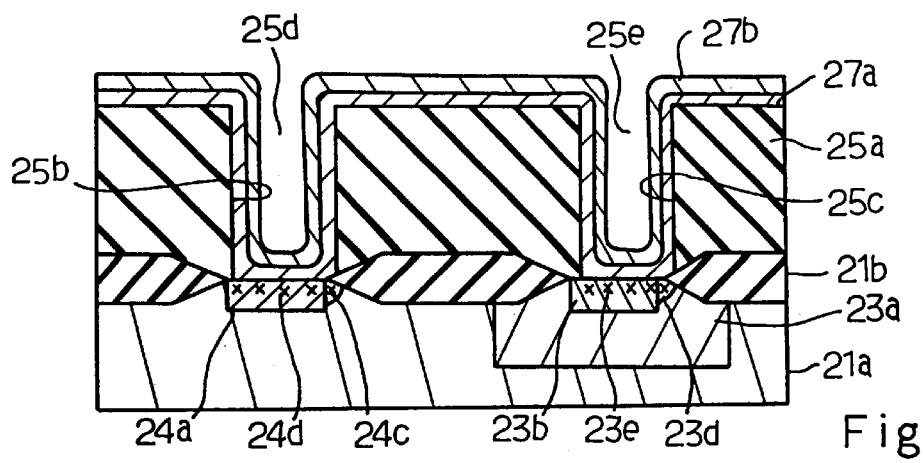

Titanium nitride is sputtered over the titanium layer 27a, and the titanium layer 27a is overlain by a titanium nitride layer 27b as shown in FIG. 4F. The titanium nitride layer 7b is 100 nanometers thick over the upper surface of the inter-level insulating layer 25a. The titanium nitride layer 27b defines secondary holes 25d and 25e in the contact holes 25b and 25c, respectively. The titanium nitride layer 27b serves as a protective layer as similar to that of the first embodiment.

Figure 4G:
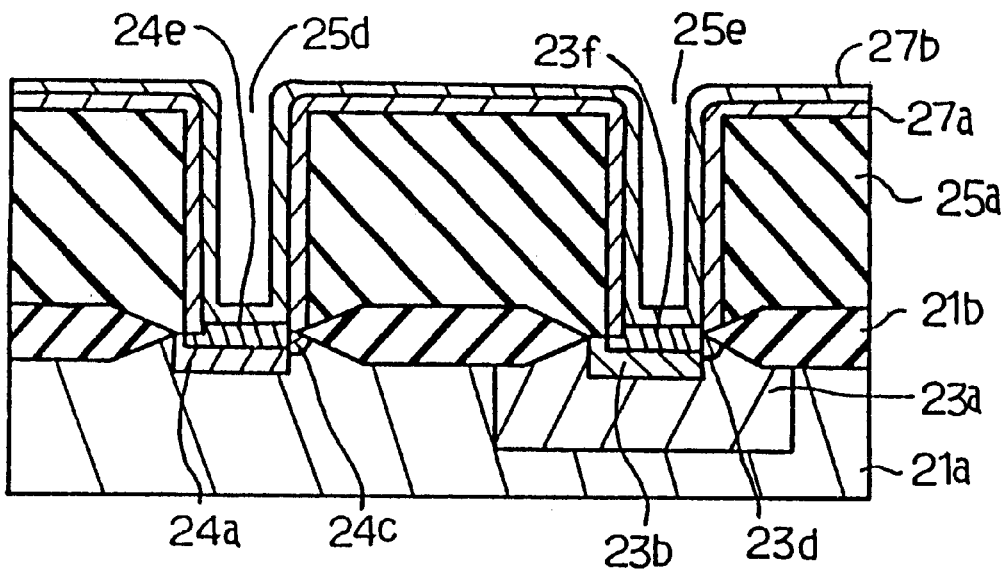

The resultant semiconductor structure is placed in inert ambience containing nitrogen, and is heated to between 400 degrees and 500 degrees centigrade. The semiconductor structure is maintained in the high temperature inert ambience for 10 minutes to 60 minutes, and the titanium reacts with the p-type amorphous silicon 23e and the n-type amorphous silicon 24d so as to form titanium silicide layers 23e/24d as shown in FIG. 4G. Thus, the titanium reacts with the silicon at 400 degrees to 500 degrees centigrade, because the silicon is amorphous. The p-type amorphous silicon and the n-type amorphous silicon are recrystallized during the annealing, and the ion-implanted arsenic is activated. The annealing temperature is low enough that the heavily doped n-type single crystal impurity region 24a and the heavily doped p-type single crystal impurity region 23b maintain the impurity profiles. Even though the arsenic is activated, the single crystal impurity region 23b/23d are maintained in the p-type.

Figure 4H:
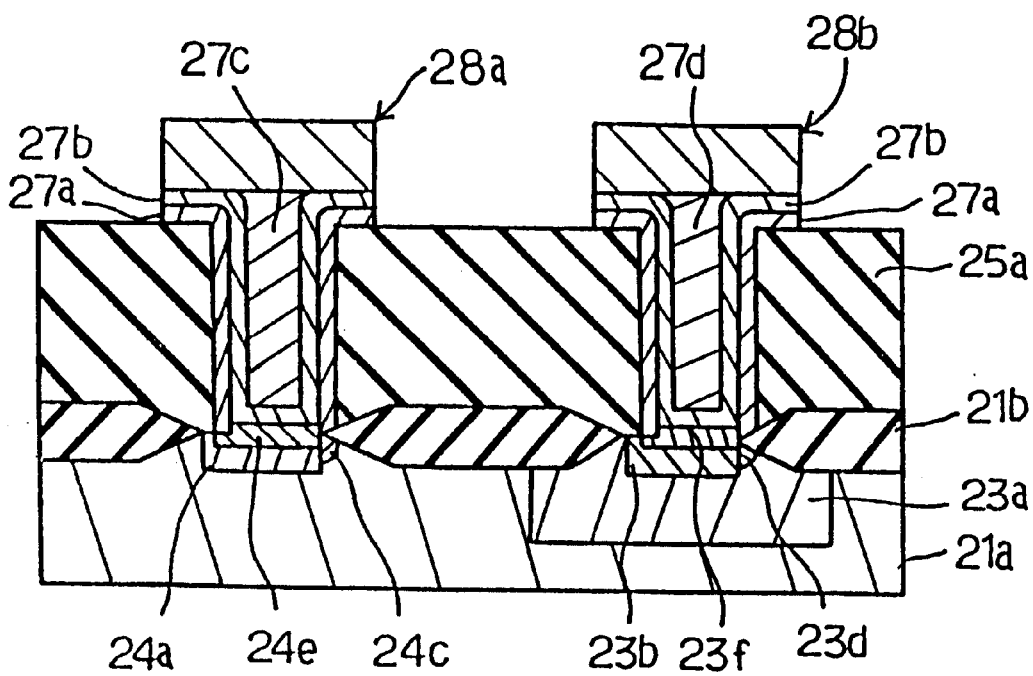

Subsequently, the secondary holes 25d/25e are plugged with pieces of tungsten 27c/27d, and multi-layer wirings 28a/28b are patterned on the inter-level insulating layer 25a as similar to the first embodiment. The resultant semiconductor structure is illustrated in FIG. 4H.

The process implementing the third embodiment achieves all the advantages of the first embodiment. Moreover, the boron and the phosphorous are activated at approximately 100 percent during the heat treatment described in conjunction with FIG. 4D, and the reverse leakage current is decreased from those of the first and second embodiments.

If the arsenic increases the contact resistance between the heavily doped p-type single crystal impurity region 23b/23d and the titanium silicide layer 23e to non-acceptable level, boron difluoride may be ion implanted into the heavily doped p-type single crystal impurity region 23b/23d instead of the arsenic. The p-type amorphous silicon layer 23e and the n-type amorphous silicon layer 24d may be formed through an ion-implantation of boron difluoride and an ion-implantation of phosphorous, respectively.

Fourth Embodiment

Figure 5A:
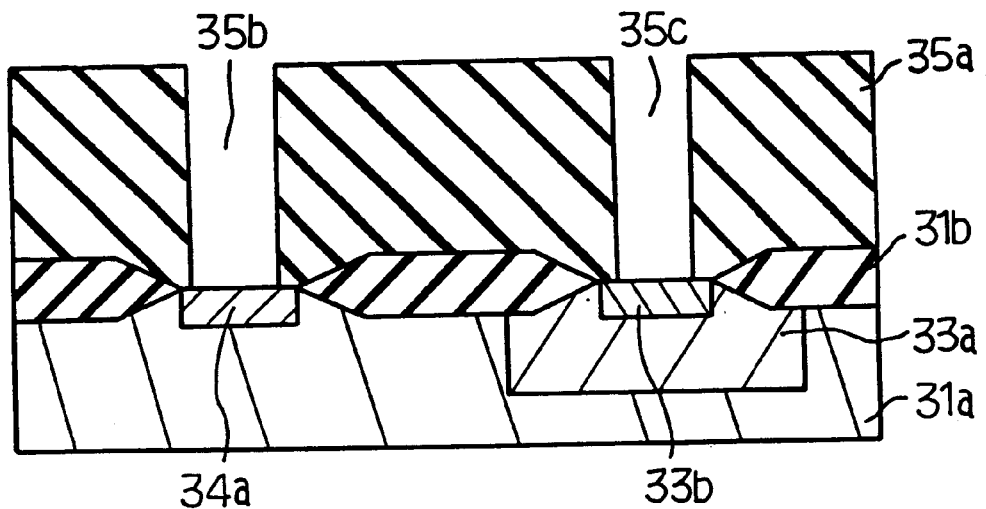
FIGS. 5A and 5B are cross sectional views showing essential steps of still another process of fabricating a semiconductor device according to the present invention.
Figure 5B:
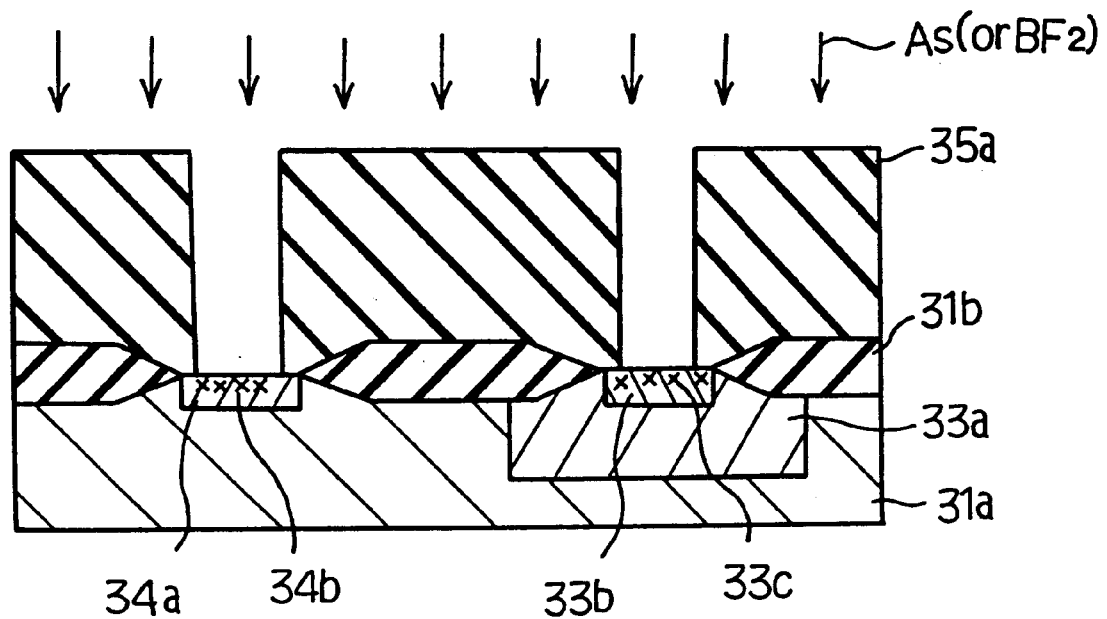

FIGS. 5A and 5B illustrate still another process of fabricating a semiconductor device embodying the present invention. The process implementing the fourth embodiment is available for impurity regions wide enough to nest contact holes therein.

The process starts with preparation of a p-type single crystal silicon substrate 31a, and a field oxide layer 31b is selectively grown on the major surface of the p-type silicon substrate 31a. The field oxide layer 31b defines a plurality of active areas in the major surface, and two active areas are shown in FIGS. 5A and 5B. A lightly doped n-type well 33a is formed in one of the active areas, and a heavily doped p-type impurity region 33b and a heavily doped n-type impurity region 34a are formed in the lightly doped n-type well 33a and the other of the active areas, respectively. The heavily doped p-type impurity region 33b is electrically isolated from the heavily doped n-type impurity region 34a by means of the field oxide layer 31b.

Boro phospho-silicate glass is deposited to 1.5 microns thick over the entire surface of the resultant semiconductor structure by using a chemical vapor deposition, and forms an inter-level insulating layer 35a.

A photo-resist etching mask (not shown) is provided on the inter-level insulating layer 35a through lithography. Using the photo-resist etching mask, the inter-level insulating layer 35a is selectively etched so as to form contact holes 35b and 35c therein. The heavily doped n-type impurity region 34a and the heavily doped p-type impurity region 33b are respectively exposed by the contact holes 35b/35c as shown in FIG. 5A. The photo-resist etching mask is then stripped off.

There is an margin between the heavily doped single crystal impurity regions 34a/33b and the contact holes 35b/35c as described hereinbefore. For this reason, even if the photo-resist etching mask is mis-aligned with the target areas over the heavily doped single crystal impurity regions 34a/33b, the contact holes 35b/35c are still nested in the heavily doped single crystal impurity regions 34a/33b, respectively.

Arsenic or boron difluoride is ion implanted through the contact holes 35b/35c into the heavily doped n-type single crystal impurity region 34a and the heavily doped p-type single crystal impurity region 33b as similar to the third embodiment. The ion bombardment makes a surface portion 34b of the heavily doped n-type single crystal impurity region 34a and a surface portion 33c of the heavily doped p-type single crystal impurity region 33b amorphous. If the arsenic is ion implanted, the dose should be selected in such a manner that the implanted arsenic does not change the conductivity type of the heavily doped p-type single crystal impurity region 33b. Similarly, if the boron difluoride is ion implanted, the dose should be selected in such a manner that the implanted boron does not change the conductivity type of the heavily doped n-type single crystal impurity region 34a.

Thereafter, the process proceeds to the steps shown in FIGS. 4F to 4H.

Fifth Embodiment

FIGS. 6A to 6E illustrate still another process of fabricating a semiconductor device embodying the present invention. The process starts with preparation of a p-type single crystal silicon substrate 41a, and a field oxide layer 41b is selectively grown on the major surface of the p-type silicon substrate 41a. The field oxide layer 41b defines a plurality of active areas in the major surface, and two active areas are shown in FIGS. 6A to 6E. A lightly doped n-type well 43a is formed in one of the active areas, and a heavily doped p-type impurity region 43b and a heavily doped n-type impurity region 44a are formed in the lightly doped n-type well 43a and the other of the active areas, respectively. The heavily doped p-type impurity region 43b is electrically isolated from the heavily doped n-type impurity region 44a by means of the field oxide layer 41b.

Boro phospho-silicate glass is deposited over the entire surface of the resultant semiconductor structure, and forms an inter-level insulating layer 45a.

Figure 6A:
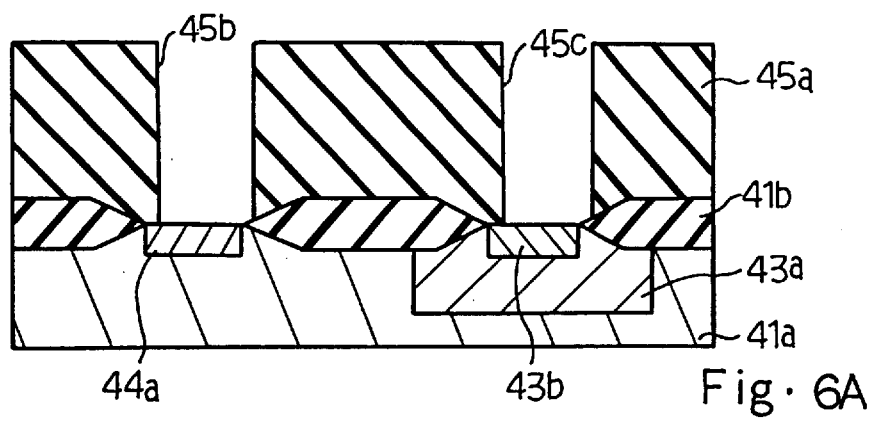
FIGS. 6A to 6E are cross sectional views showing still another process of fabricating a semiconductor device according to the present invention.

A photo-resist etching mask (not shown) is provided on the inter-level insulating layer 5a through lithography. Using the photo-resist etching mask, the inter-level insulating layer 45a is selectively etched so as to form contact holes 45b and 45c therein. The heavily doped n-type impurity region 44a and the heavily doped p-type impurity region 43b are respectively exposed by the contact holes 45b/45c as shown in FIG. 6A.

Figure 6B:
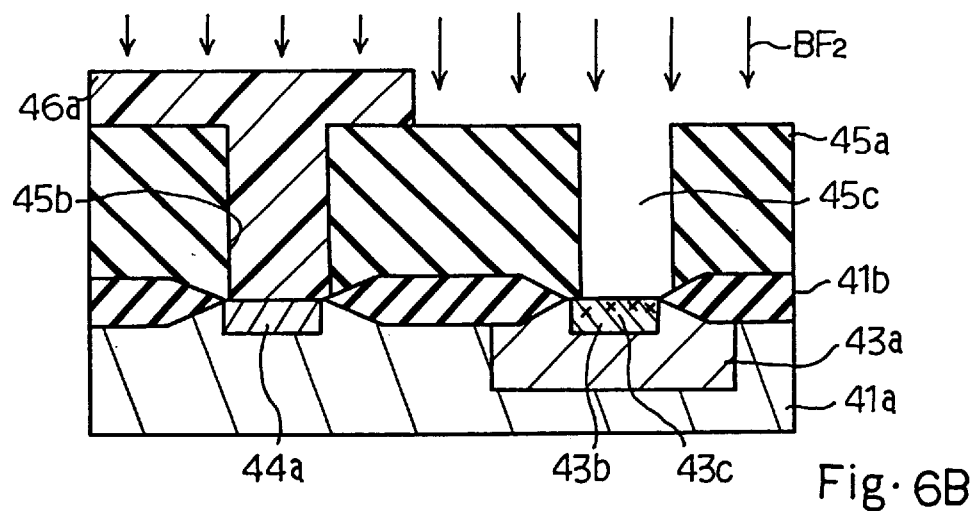

Subsequently, a photo-resist ion-implantation mask 46a is formed on the inter-level insulating layer 45a by using lithography, and the heavily doped n-type impurity region 44a is covered with the photo-resist ion-implantation mask 46a. Boron difluoride ($BF_2$) is ion-implanted through the contact hole 45c into the heavily doped p-type single crystal impurity region 43b, and a surface portion of the heavily doped p-type impurity region 43a becomes amorphous due to the ion bombardment expressed by mark "x". Thus, a p-type amorphous silicon layer 43c is formed in the heavily doped p-type single crystal impurity region 43b as shown in FIG. 6B. After the ion-implantation, the photo-resist ion-implantation mask 46a is stripped off, and the heavily doped n-type single crystal impurity region 44a is exposed again.

Figure 6C:
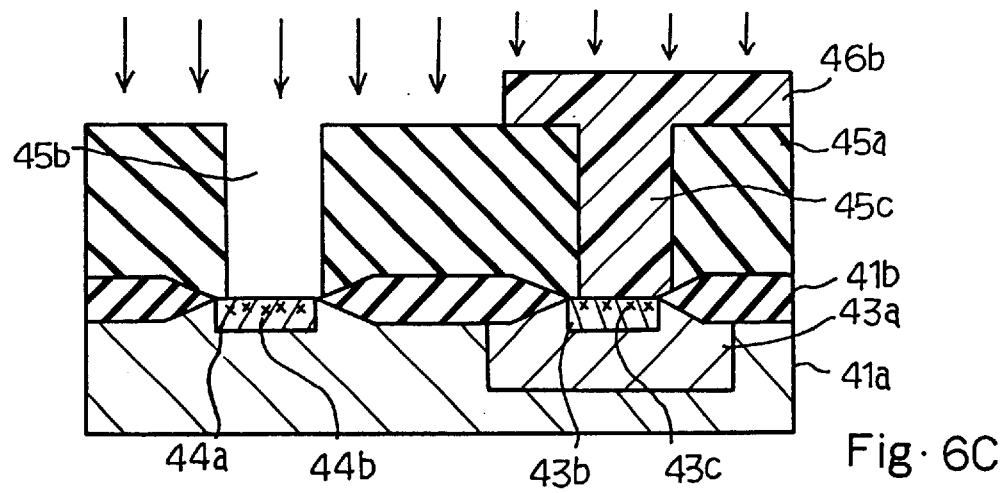

Another photo-resist ion-implantation mask 46b is provided on inter-level insulating layer 45a by using the lithography, and the p-type amorphous silicon layer 43c is covered with the photo-resist ion-implantation mask 46b. Phosphorous is ion implanted through the contact hole 45b into the heavily doped n-type single crystal impurity region 44a, and a surface portion of the heavily doped n-type single crystal impurity region 44a becomes amorphous due to the ion bombardment expressed by mark "x". Thus, an n-type amorphous silicon layer 44b is formed in the surface portion as shown in FIG. 6C. After the ion-implantation, the photo-resist ion-implantation mask 46b is stripped off. Subsequently, titanium is deposited over the entire surface of the resultant semiconductor structure by using a plasma-assisted chemical vapor deposition. In detail, the resultant semiconductor structure is placed in a reaction chamber of a plasma-assisted chemical vapor deposition system (not shown), and the p-type semiconductor substrate 41a is heated to between 450 degrees and 650 degrees centigrade. A gaseous mixture is introduced into the reaction chamber, and is regulated to between 1 torr and 100 torr. The gaseous mixture contains $TiCl_4$, $H_2$ and Ar, and flow rates of $TiCl_4$, $H_2$ and Ar are regulated from 5 sccm to 20 sccm, 1000 sccm to 2000 sccm and 200 sccm to 500 sccm, respectively. $TiCl_4$ is decomposed, and the entire surface of the semiconductor structure is covered with a titanium layer 47a. The titanium immediately reacts with the amorphous silicon, and titanium silicide layers 43d/44c are formed on the p-type amorphous silicon layer 43c and the n-type amorphous silicon layer 44b. There is no substantial time delay between the introduction of the gaseous mixture and the deposition of titanium, and the titanium silicide layer 43d is approximately equal in thickness to the titanium silicide layer 44c regardless of the conductivity type of the amorphous silicon. When the titanium layer 47a on the amorphous silicon layers 44b/43c reaches a certain thickness equivalent to a titanium layer ranging between 3 nanometers to 10 nanometers thick, the plasma-assisted chemical vapor deposition is completed. When the titanium layer 47a is assumed to be uniformly grown, the titanium silicide layers 43d/44c range between 7.5 nanometers to 25 nanometers thick.

Figure 6D:
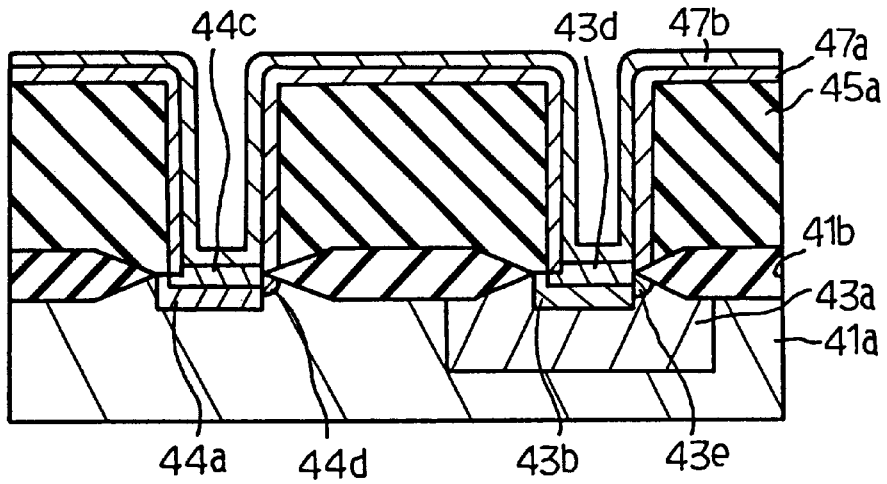

Subsequently, titanium nitride is deposited from 30 nanometers to 50 nanometers thick over the titanium layer 47a and the titanium silicide layers 43d/44c by using a low-pressure chemical vapor deposition. The p-type silicon substrate 41a is heated to between 450 degrees and 650 degrees centigrade, and a gaseous mixture of $TiCl_4$, $NH_3$ and $N_2$ is regulated to between 1 torr and 100 torr. The flow rates of TiCl$_4$, NH$_3$ and N$_2$ are regulated from 20 sccm to 50 sccm, 50 sccm to 100 sccm and 2000 sccm to 5000 sccm, respectively. Thus, the titanium layer 47a and the titanium silicide layers 43d/44c are covered with a titanium nitride layer 47b as shown in FIG. 6D.

The p-type amorphous layer 43c and the n-type amorphous layer 44b are recrystallized during the chemical vapor depositions. Even if the boron and the phosphorous are ion implanted into the peripheries beneath the field oxide layer 41b, the boron and the phosphorous are activated during the chemical vapor depositions, and an additional p-type region 43e and an additional n-type region 44d are merged with the heavily doped p-type single crystal impurity region 43b and the heavily doped n-type single crystal impurity region 44a, respectively.

If the activation and the recrystallization is insufficient, a large amount of reverse current flows through the junction. A post annealing may be carried out at 450 degrees to 500 degrees centigrade for 30 minutes or 700 degrees centigrade for 30 seconds after the formation of the titanium nitride layer 42.

Subsequently, tungsten is deposited over the titanium nitride layer 47b. The tungsten fills the secondary holes defined by the titanium nitride layer 47b, and swells into a tungsten layer over the inter-level insulating layer 45a. A photo-resist etching mask (not shown) is formed on the tungsten layer by using lithography, and the tungsten layer is selectively etched away. As a result, tungsten plugs 47c/47d are left in the secondary holes. The photo-resist etching mask is stripped off.

Figure 6E:
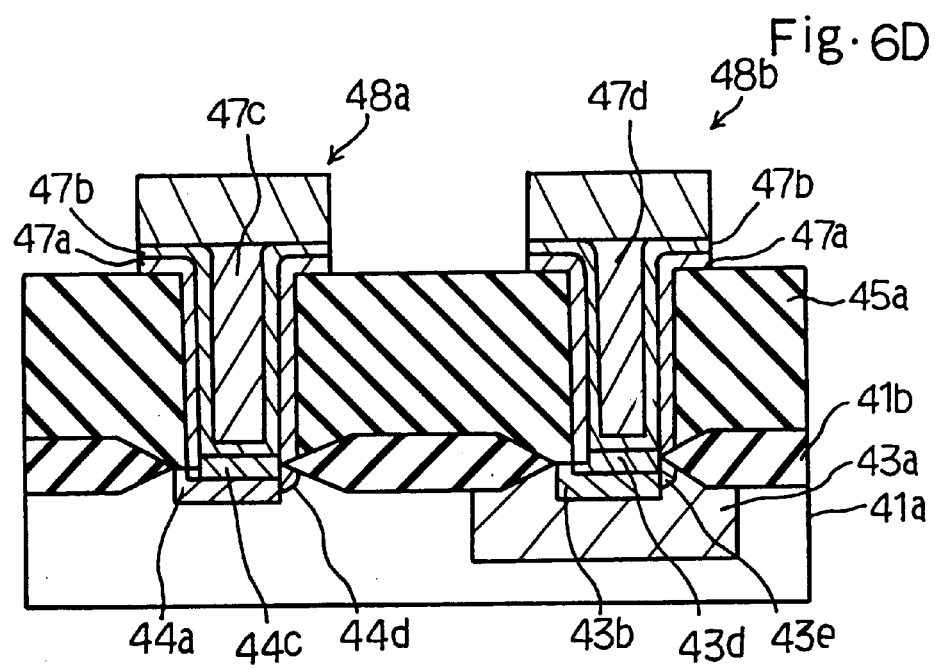

Aluminum alloy is deposited over the entire surface of the titanium nitride layer 47b by using a sputtering, and a photo-resist etching mask (not shown) is provided on the aluminum alloy layer by using lithography. The aluminum alloy layer, the titanium nitride layer 47b and the titanium layer 47a are selectively etched away, and form multi-layer metal wirings 48a and 48b as shown in FIG. 6E.

Boron and arsenic are available for making the single crystal impurity regions amorphous.

As will be understood from the foregoing description, the chemically active amorphous silicon layers 43c/44b are exposed by the contact holes 45b/45c, and no substantial time delay is introduced between the supply of TiCl$_4$ and the deposition of titanium. As a result, the titanium silicide layers 43d/44c equal in thickness are concurrently grown on the impurity regions 43b/44a, respectively, and do not deteriorate electric characteristics of the semiconductor device. The delay time is clear at a low temperature less than 60 degrees in centigrade.

The titanium is deposited by using the chemical vapor deposition as described hereinbefore. The chemical vapor deposition creates a uniform layer rather than the sputtering, and the titanium on the amorphous layers easily exceeds 10 nanometers thick. It is not necessary to regulate the titanium on the amorphous layers to 10 nanometers or less. However, a thin titanium layer decreases the contact resistance.

Figure 7:
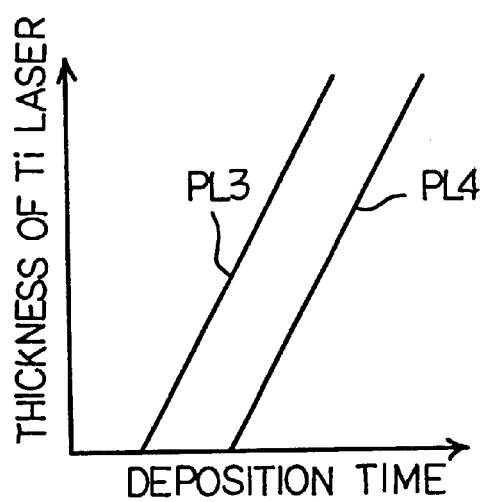
FIG. 7 is a graph showing relation between the thickness of a titanium layer and the conductivity type of a silicon layer thereunder.

If titanium is directly deposited on a p-type single crystal impurity region and an n-type single crystal impurity region without the ion-bombardment shown in FIGS. 6B and 6C, the titanium decomposed from TiCl$_4$ is deposited as indicated by plots PL3 and PL4 in FIG. 7, and the titanium layer on the n-type single crystal impurity region becomes much thicker than the titanium layer on the p-type single crystal impurity region. This is because of the fact that long time delay is introduced from the supply of TiCl$_4$ and the deposition of titanium on the p-type single crystal impurity region. As a result, the contacts suffers from either leakage current or contact resistance as described in conjunction with the prior art.

On the other hand, the contacts according to the present invention are small in leakage current and low in contact resistance by virtue of the titanium silicide layers equally deposited on the amorphous layers.

Although particular embodiments of the present invention have been shown and described, it will be obvious to those skilled in the art that various changes and modifications may be made without departing from the spirit and scope of the present invention.

For example, the present invention is applicable to other refractory metals in so far as the refractory metal is chemically active on an amorphous silicon layer.

What is claimed is:

1. A process of fabricating a semiconductor device on a substrate, comprising the steps of:
    a) preparing a crystalline silicon layer including a first region having a first conductivity type and a second region spaced apart from said first region and having a second conductivity type opposite to said first conductivity type;
    b) forming an insulating layer over said crystalline silicon layer;
    c) forming a first opening and a second opening in said insulating layer so as to expose said first region and said second region to said first opening and said second opening, respectively;
    d) implanting a first dopant impurity of said first conductivity type into said first region and said second region through said first opening and said second opening so as to make said first region and said second region amorphous;
    e) covering said first region with a mask;
    f) implanting a second dopant impurity of said second conductivity type into said second region through said second opening in a quantity greater than said first dopant impurity so as to maintain said second region in said second conductivity type;
    g) removing said mask;
    h) depositing a refractory metal layer on the amorphous first region and the amorphous second region so that said refractory metal layer is in contact with said amorphous first region and said amorphous second region; and
    i) treating said refractory metal layer with heat so as to partially convert said refractory metal layer to refractory metal silicide layers in contact with said amorphous first and amorphous second regions.

2. The process as set forth in claim 1, in which said refractory metal layer in contact with said amorphous first and amorphous second regions has a thickness ranging from 3 nanometers to 10 nanometers.

3. The process as set forth in claim 2, in which said refractory metal layer is formed of titanium.

4. The process as set forth in claim 1, in which said first dopant impurity is implanted to a concentration of at least $3 \times 10^{14}/cm^2$.

5. The process as set forth in claim 1, wherein the crystalline silicon layer is a single crystal silicon layer.

6. The process as set forth in claim 5, wherein the single crystal silicon layer is a p-type single crystal silicon layer.

7. A process of fabricating a semiconductor device on a substrate, comprising the steps of
    a) preparing a crystalline silicon layer including a first region having a first conductivity type and a second region spaced apart from said first region and having a second conductivity type opposite to said first conductivity type;

b) forming an insulating layer over said crystalline silicon layer;

c) forming a first opening and a second opening in said insulating layer so as to expose said first region and said second region through said first opening and said second opening, respectively;

d) implanting a first dopant impurity of said first conductivity type into said first region;

e) implanting a second dopant impurity of said second conductivity type into said second region;

f) treating said first and second regions with heat under conditions where said first dopant impurity and said second dopant impurity are substantially completely activated;

g) implanting boron difluoride as a third dopant impurity into said first and second regions in a quantity less than said first dopant impurity and said second dopant impurity so as to make said first and second regions amorphous;

h) depositing a refractory metal layer on the amorphous first region and the amorphous second region so that said refractory metal layer is in contact with said amorphous first region and said amorphous second region; and i) treating said refractory metal layer with heat so as to partially convert said refractory metal layer into refractory metal silicide layers in contact with said amorphous first and amorphous second regions.

8. A process of fabricating a semiconductor device on a substrate, comprising the steps of a) preparing a crystalline silicon layer including a first region having a first conductivity type and a second region spaced apart from said first region and having a second conductivity type opposite through said first conductivity type;

b) forming an insulating layer over said crystalline silicon layer;

c) forming a first opening and a second opening in said insulating layer so as to expose said first region and said second region to said first opening and said second opening, respectively;

d) implanting a first dopant impurity of said first conductivity type into said first region;

e) implanting a second dopant impurity of said second conductivity type into said second region;

f) treating said first and second regions with heat under conditions where said first dopant impurity and said second dopant impurity are substantially completely activated;

g) implanting a third dopant impurity into said first and second regions in a quantity less than said first dopant impurity and said second dopant impurity so as to make said first and second regions amorphous;

h) depositing a refractory metal layer on the amorphous first region and the amorphous second region so that said refractory metal layer is in contact with said amorphous first region and said amorphous second region; and i) treating said refractory metal layer with heat so as to partially convert said refractory metal layer into refractory metal silicide layers in contact with said amorphous first and amorphous second regions, in wich said steps g) includes the sub-steps of:

g-1) implanting a first sub-dopant impurity of said third dopant impurity of one of said first and second conductivity types into said region through said first opening, and g-2) implanting a second sub-dopant impurity of said third dopant impurity of the other of said first and second conductivity types into said second region through said second opening.

* * * * *